United States Patent
Wu et al.

(10) Patent No.: US 7,545,304 B1
(45) Date of Patent: Jun. 9, 2009

(54) DISTRIBUTED ARBITRARY WAVEFORM GENERATOR

(75) Inventors: Hui Wu, Pittsford, NY (US); Yunliang Zhu, Rochester, NY (US); Jonathan D. Zuegel, Rochester, NY (US); John R. Marciante, Webster, NY (US)

(73) Assignee: University of Rochester, Rochester, NY (US)

( * ) Notice: Subject to any disclaimer, the term of this patent is extended or adjusted under 35 U.S.C. 154(b) by 0 days.

(21) Appl. No.: 11/896,617

(22) Filed: Sep. 4, 2007

Related U.S. Application Data

(60) Provisional application No. 60/841,546, filed on Sep. 1, 2006.

(51) Int. Cl.
*H03M 1/66* (2006.01)
(52) U.S. Cl. ........................ 341/144; 341/147
(58) Field of Classification Search ............... 341/144, 341/147; 327/106, 107, 261
See application file for complete search history.

(56) References Cited

U.S. PATENT DOCUMENTS 6,573,763 B2 * 6/2003 Iijima ........................ 327/107
7,385,543 B2 * 6/2008 Jungerman .................. 341/144
2005/0141605 A1 * 6/2005 Akahori et al. ............. 375/239

OTHER PUBLICATIONS

M. D. Skeldon, "A High-Bandwidth Electrical Waveform Generator Based on an Aperture-Coupled Stripline," Review of Scientific Instruments, vol. 71, No. 9, Sep. 2000.
Zhu et al., "A 10 GS/s Distributed Waveform Generator for Sub-Nanosecond Pulse Generation and Modulation on 0.18 μm Standard Digital CMOS," IEEE Radio-Frequency Integrated Circuits (RFIC) Symposium Digest of Papers, pp. 35-38, Jun. 2007.

* cited by examiner

*Primary Examiner*—Brian Young
(74) *Attorney, Agent, or Firm*—Blank Rome LLP

(57) ABSTRACT

A distributed arbitrary waveform generator (DAWG) synthesizes the target waveform using a series of narrow pulses generated by a number of pulse generators. To achieve this, it uses an input trigger signal to control all the pulse generators, each of which generates a narrow pulse (impulses) at a specific sample time, and then all the impulses are combined to generate the output waveform. The input trigger signal is distributed to each pulse generator by a trigger distribution network. Impulses generated by pulse generators can be tuned in both pulse amplitude and width, and the spacing between them can be tuned by the trigger distribution network. Therefore the waveforms generated are completely reconfigurable.

15 Claims, 7 Drawing Sheets

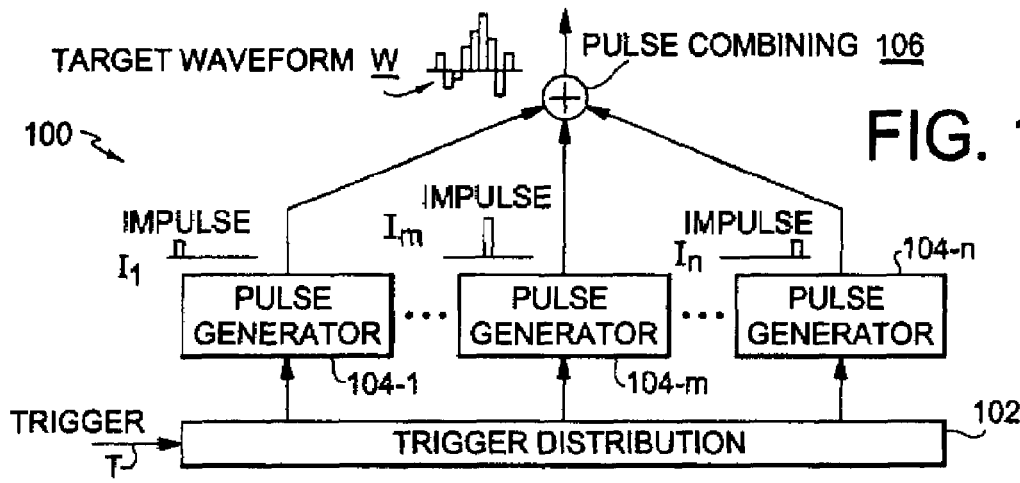
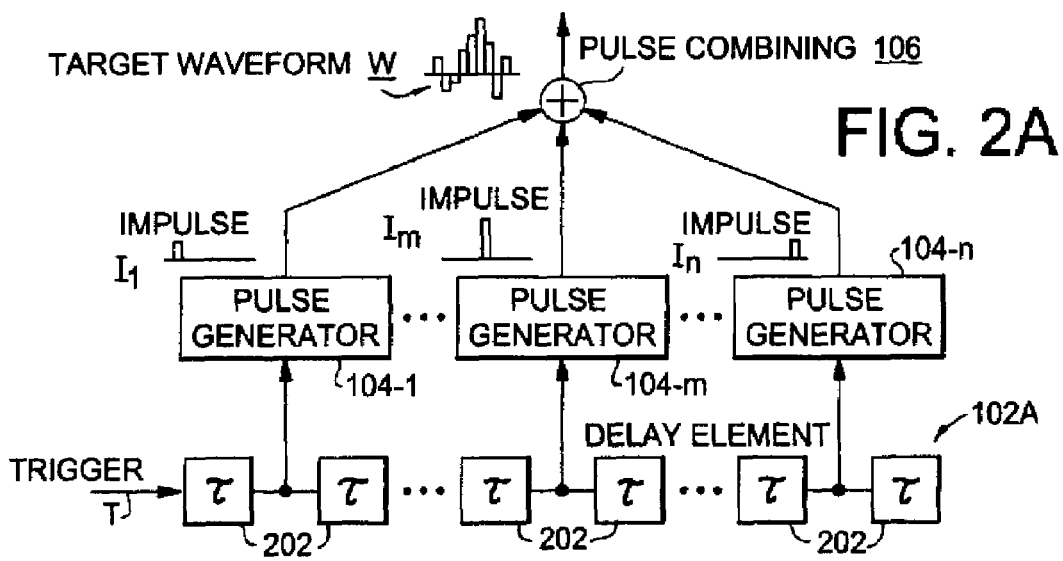
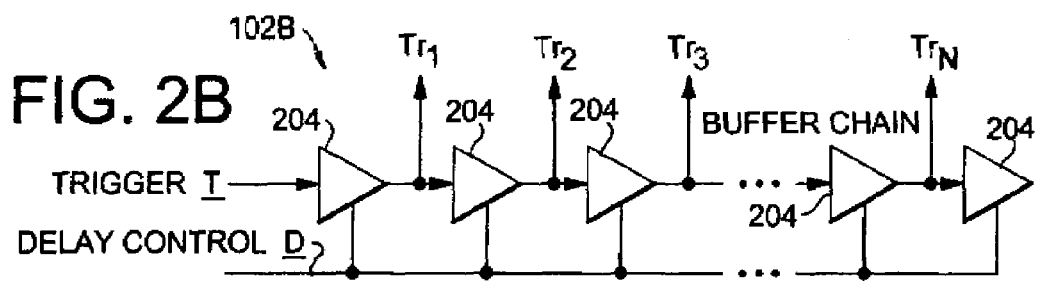

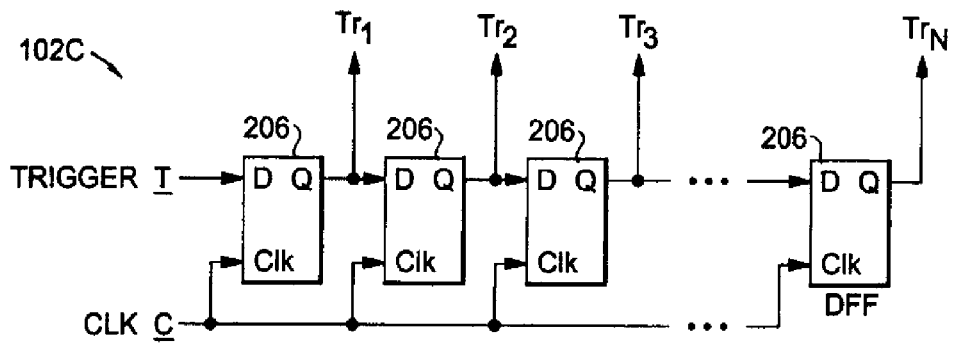
FIG. 2C
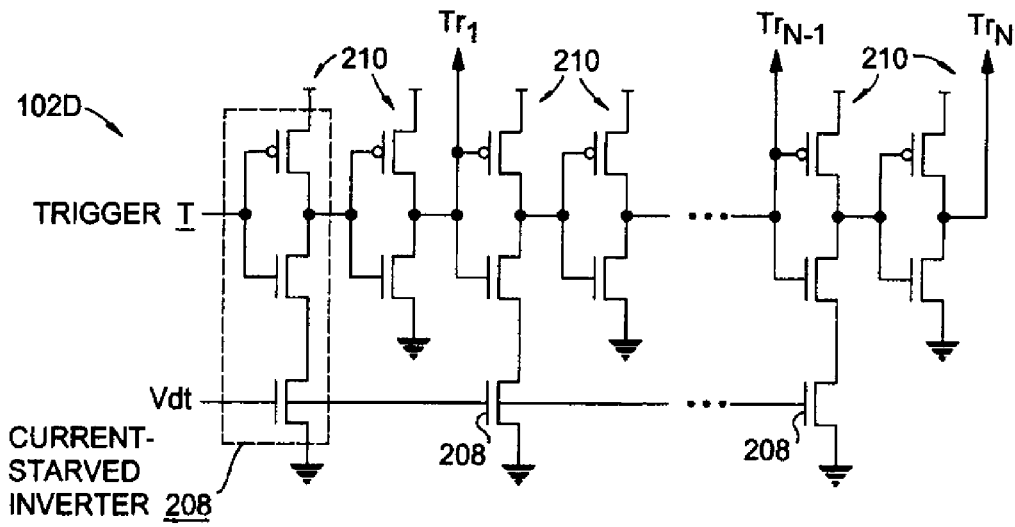
FIG. 2D
FIG. 3A
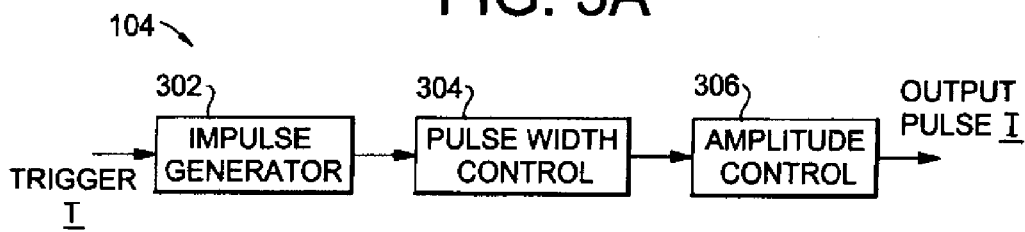

DISTRIBUTED ARBITRARY WAVEFORM GENERATOR

REFERENCE TO RELATED APPLICATION

The present application claims the benefit of 60/841,546, filed Sep. 1, 2006, whose disclosure is hereby incorporated by reference in its entirety into the present disclosure.

FIELD OF THE INVENTION

The present invention is directed to an arbitrary waveform generator and more particularly to such an arbitrary waveform generator which uses distributed circuit architecture.

DESCRIPTION OF RELATED ART

Wideband waveform generation is a critical function in modern communication and instrumentation systems. In high-speed test and measurement applications, an arbitrary waveform generator (AWG) is an indispensable time-domain instrument, and it is widely used to generate various waveforms in ultrafast phenomenon experiments across all major scientific and technological domains. For example, sub-nanosecond pulses with a variety of waveforms are needed to modulate the laser beam in inertial-confinement fusion (ICF) experiments, as taught in M. D. Skeldon, "A High-Bandwidth Electrical Waveform Generator Based on an Aperture-Coupled Stripline," Rev. Sci. Instrum., (71):3559-3566, 2000. In high-speed communications, pulse shaping, the time-domain equivalent of waveform generation, is commonly employed to achieve the best performance (data rate) within the limitations of the communication channel. In particular, wideband pulse synthesis becomes increasingly important in ultra-wideband (UWB) communications, which have stringent constraints on pulse spectrum due to the FCC-mandated emission mask and interferences requirements with wireless local area networks (WLAN).

As in other sampling systems, there is a trade-off between the time resolution (sampling rate) and amplitude resolution (dynamic range) for an AWG. High sampling rate makes it very difficult to achieve large dynamic range in a high-speed AWG. In addition, the bandwidth of a high-speed AWG has also become a bottleneck since it is not only determined by the AWG sampling rate, but also limited by the analog bandwidth of its components. Lastly, an AWG needs to be highly reconfigurable in order to compensate environment change, regulatory difference, and signal fading effect in communications, and simply to be useful in instrumentation applications. Therefore, it is a great challenge to design and implement an AWG with high sampling rate, large dynamic range, wide bandwidth, and good reconfigurability.

SUMMARY OF THE INVENTION

It is therefore an object of the invention to provide an AWG implementation which can address that challenge.

To achieve the above and other objects, the present invention is directed to a distributed arbitrary waveform generator (DAWG) which synthesizes the target waveform using a series of narrow pulses generated by a number of pulse generators. To achieve this, it uses an input trigger signal to control all the pulse generators, each of which generates a narrow pulse (impulses) at a specific sample time, and then all the impulses are combined to generate the output waveform. The input trigger signal is distributed to each pulse generator by a trigger distribution network. Impulses generated by pulse generators can be tuned in both pulse amplitude and width, and the spacing between them can be tuned by the trigger distribution network. Therefore the waveforms generate are completely reconfigurable. Such a distributed architecture gives a DAWG distinctive advantages compared to conventional AWG implementations as disclosed below.

This invention is based on the following new ideas. Firstly, it is necessary to separate waveform synthesis and pulse combining in an AWG in order to achieve large bandwidth and fine time resolution. In conventional AWG implementations based on time interleaving, the functions of waveform synthesis and pulse combing are usually inseparable. In a DAWG, the timing of sampling points on the waveform is now controlled by the trigger distribution network, while pulse combining is done by the output pulse combiner.

Secondly, it is desirable to use an individual pulse generator in each tap. Since narrow pulses are generated locally, only relatively low-speed trigger signal needs to be distributed to each tap. Hence the trigger distribution network does not require large bandwidth, and can be designed for timing control only. In turn, because the timing control requirement is no longer applied, the pulse combining block can be designed to have low loss and large bandwidth. Such a divide-and-conquer approach removes the constraints of delay-bandwidth trade-off in other wideband pulse processing circuits, such as distributed transversal filter. In a DAWG, circuit complexity is traded with the bandwidth. In the integrated circuit implementation, circuit complexity can be easily accommodated due to the good integration capability, especially in CMOS technologies. Increasing circuit complexity may also increase the power consumption. Because the bandwidth requirement is relieved for the trigger distribution network, very low-power digital circuits can be utilized which can greatly reduce the overall power consumption. Note that power consumption now is proportional to the pulse repetition rate.

In this disclosure, we present a new AWG implementation using a distributed circuit architecture, namely, distributed arbitrary waveform generator (DAWG). It can directly synthesize waveforms in sub-nanosecond regimes with large dynamic range and reconfigurable spectra. Compared to conventional AWG implementations, it can achieve much larger bandwidth, while consuming less power. The invention will potentially lead to new applications of AWGs in communications, instrumentation, radar, and other ultrafast electronic systems.

The following publications are hereby incorporated by reference in their entireties into the present disclosure:

"A 9 GSample's Distributed Arbitrary Waveform Generator in 0.18 m CMOS for Ultra-Wideband Communications", by Yunliang Zhu, Jonathan D. Zuegel, John R. Marciante and Hui Wu, 2006 IEEE Custom Integrated Circuits Conference, Sep. 10-13, 2006; and "A 10 GS/s Distributed Waveform Generator for Sub-Nanosecond Pulse Generation and Modulation in 0.18 µm Standard Digital CMOS, by Yunliang Zhu, Jonathan D. Zuegel, John R. Marciante and Hui Wu, *IEEE Radio-Frequency Integrated Circuits (RFIC) Symposium Digest of Papers*, pp. 35-38, June 2007.

BRIEF DESCRIPTION OF THE DRAWINGS

Preferred embodiments of the present invention will be set forth in detail with reference to the drawings, in which:

FIG. 1 shows a distributed arbitrary waveform generator architecture;

FIGS. 2A-2D show the use of active delay lines for trigger distribution: FIG. 2A, overall diagram; FIG. 2B, asynchronous active delay line; FIG. 2C, synchronous active delay line; FIG. 2D, one design example for transistor level implementation of asynchronous active delay line;

FIGS. 3A-3D show a pulse generator in DAWG: FIG. 3A, block diagram; FIG. 3B, impulse generator with switched current source as the pulse generator; FIG. 3C, detailed implementation for impulse generator with pulse width control; FIG. 3D, another implementation of pulse generator using source coupled logic;

FIG. 4A, overall diagram; FIG. 4B, elevated coplanar waveguide transmission lines (cross section);

FIGS. 8A-8B show examples waveforms synthesized using the prototype DAWG, in which FIG. 8A shows a time domain waveform and FIG. 8B shows frequency spectra.

DETAILED DESCRIPTION OF THE PREFERRED EMBODIMENTS

Figure 3B:
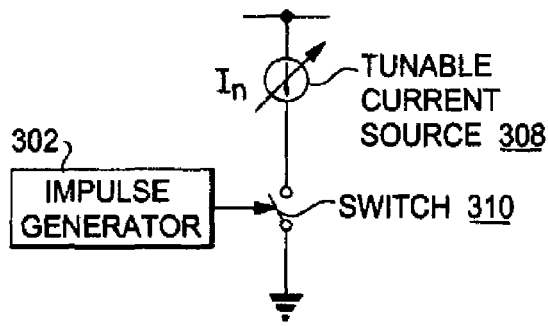

Preferred embodiments of the present invention will be set forth in detail with reference to the drawings, in which like reference numerals refer to like elements throughout.

FIG. 1 is a block diagram showing a distributed arbitrary waveform generator (DAWG) 100. A trigger signal T is input to a trigger distribution network 102, whose design will be explained below. The trigger distribution network 102 distributes the trigger signal T to a plurality of pulse generators 104-1, ... 104-$m$, ... 104-$n$, which produce impulses $I_1$, ... $I_m$, ... $I_n$ shaped in a manner to be described below. The pulses are combined by a pulse combining circuit 106 to produce the target waveform W.

Various implementations of the trigger distribution network 102 are shown in FIGS. 2A-2D as 102A, 102B, 102C and 102D. The trigger distribution network can be implemented as a delay line 102A with delay elements 202, as shown in FIG. 2A. Since it does not require large bandwidth, an active delay line will suffice, which can provide larger time delay between adjacent pulse generators and larger tuning range for time delay, while consuming a smaller chip area than passive delay lines.

The active delay line can be either asynchronous or synchronous. FIG. 2B shows the asynchronous case 102B. The active delay line is built using a chain of buffers 204, the tap delay of which can be tuned by the control signal D. FIG. 2C shows the synchronous case 102C, which uses the D-flip-flop 206 as the delay element. In this case, the tap delay would be determined by the clock signal C. As an example, a transistor-level implementation of an asynchronous current-starved active delay line is shown in FIG. 2D as 102D. The fall time of the current-starved inverter 208 in each delay element 210 can be controlled by changing the delay-tuning voltage $V_{dt}$, and so does the tap delay A. A single $V_{dt}$ can be used for all delay elements and hence the tap delay is uniform. Non-uniform sampling can be implemented by employing independent delay tuning for each tap.

The function blocks of a pulse generator 104 may include impulse generation 302, pulse width control 304 and pulse amplitude control 306, as shown in FIG. 3A, to produce an output pulse I in response to a trigger signal T. The impulse generation block 302 is triggered to generate an impulse. Then the pulse width and amplitude of the impulse is tuned by the pulse width control block 304 and the amplitude control block 306.

One way to implement pulse width and amplitude control is to switch on and off a current source by the output signal of the impulse generator, as in FIG. 3B. The pulse generator 104B of FIG. 3B includes a tunable current source 308 and a switch 310. The impulse generator 302 controls the switch 310 to turn on and off an output from the tunable current source 308. The pulse width is controlled by controlling the time during which the switch is closed, while the pulse amplitude is controlled by tuning the current source.

Figure 3C:
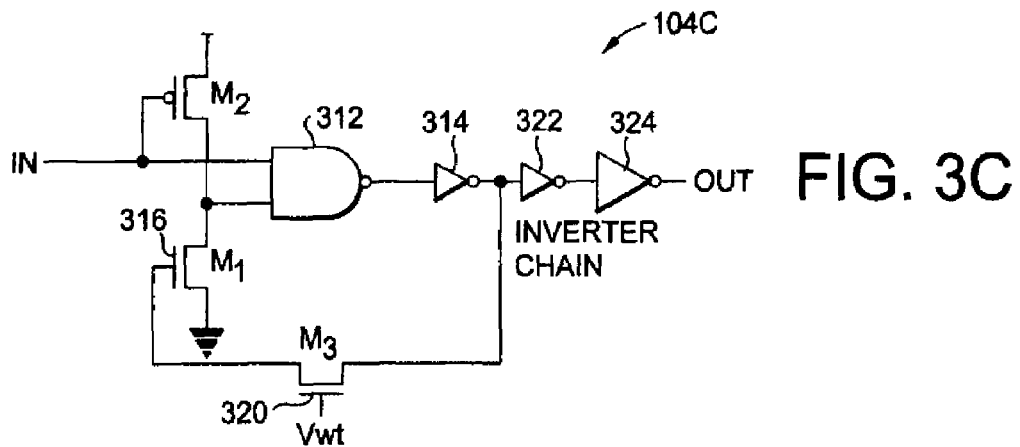

As an example, the circuit implementation of an impulse generator with tunable pulse width is shown in FIG. 3C as 104C. When a rising edge comes at the input, a short pulse is generated by the NAND operation of the input step signal and its delayed version. The delay time in the feedback loop, which consists of the propagation delay of the NAND gate 312, the following inverter 314 and the charging time of the NMOS transistor, $M_1$ 318, determines the pulse width. Another NMOS transistor, $M_3$ 320, is added into the feedback path as a voltage controlled resistor. By varying the width-tuning voltage $V_{wt}$, the time constant of this charging path changes, which tunes the generated pulse width. Two more inverters 322, 324 serve as the output buffer to drive the following current source.

Figure 3D:
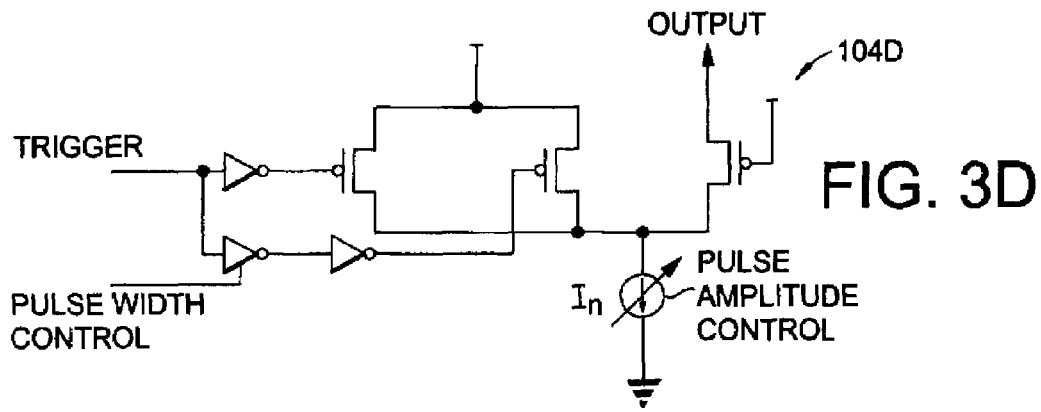

Another implementation of the pulse generator is shown in FIG. 3D as 104D, which combines the pulse width control, impulse generation and pulse amplitude control.

Figure 4A:
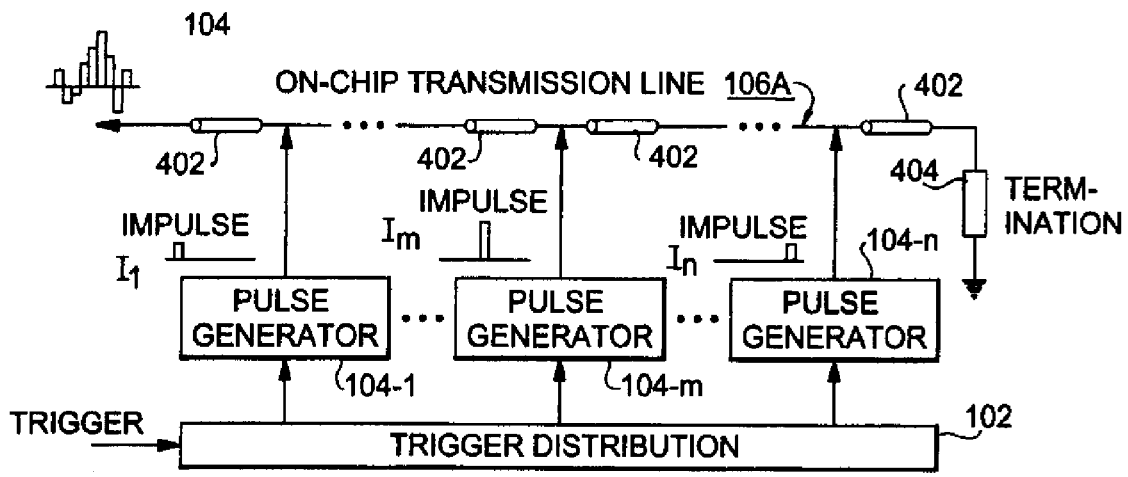
FIGS. 4A-4B show an on-chip transmission line for power/pulse combining.

Power combining at the outputs of all the current sources can be implemented using an on-chip transmission line 106A (including artificial transmission lines 402 such as LC ladders and a termination resistor 404), as shown in FIG. 4A. Such a distributed circuit structure extends the bandwidth at the output node, since the parasitic capacitance of all current sources is absorbed into the transmission line structure.

Figure 4B:
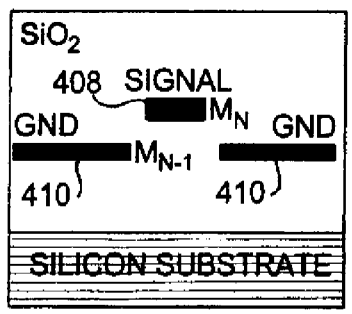

Because the required time delays can be generated by the trigger distribution network only, the output transmission line can be implemented as a planar transmission line, which tends to have smaller delay than artificial transmission lines for a given area. A possible configuration is an elevated coplanar waveguide (CPW) transmission line, which has lower loss and larger bandwidth than LC artificial transmission lines. The cross section of the elevated CPW 406 is shown in FIG. 4B, whose signal line 408 and ground lines 410 are on different metal layers. This elevated structure can achieve a larger impedance range than the normal CPWs or micro-strip lines. It also helps to meet the metal density requirements in most silicon technologies.

Figure 5:
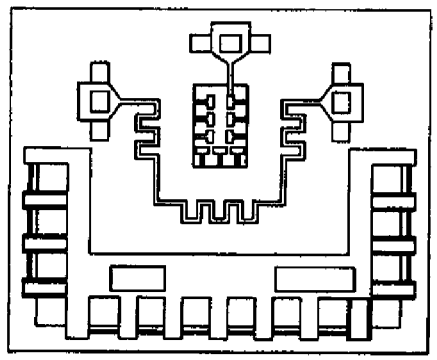
FIG. 5 is a chip micrograph of the prototype DAWG.
Figure 6:
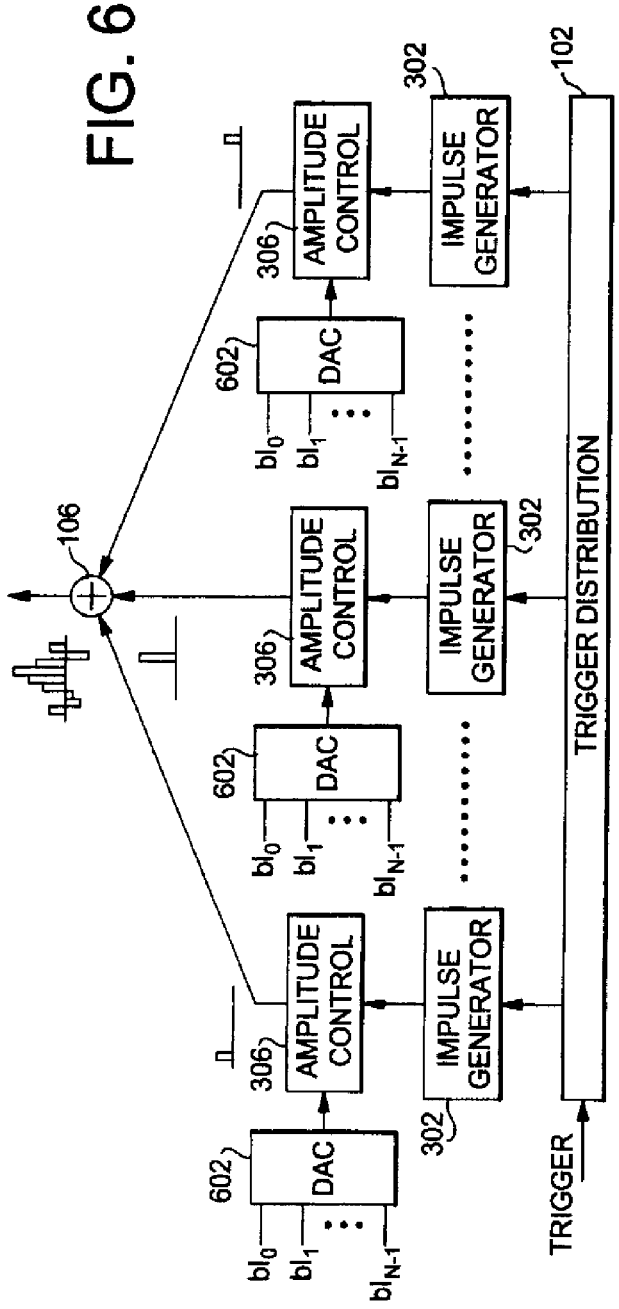
FIG. 6 shows digital control for amplitude using DACs.

Since on-chip transmission lines are used for the pulse/power combining, special layout design is needed in order to reduce the chip size. Two layout design techniques are used in the DAWG prototype. First, the active delay line is in a U shape. Second, the output transmission line is in a U shape and meandered. As seen in the chip micrograph of FIG. 5, a very compact layout design is achieved by using these two techniques. As shown in FIG. 5, the meandered output transmission line is connected between two RF pads, and the pads at the lower-half chip are for tuning controls and dc bias Pulse amplitude control signals in a DAWG can be updated digitally by using digital-to-analog converters (DAC) 602, as shown in FIG. 6. The DAC circuitry can also be implemented within the amplitude control block.

Design examples will now be disclosed. To demonstrate the basic concepts of this invention, an DAWG prototype was fabricated in a commercial 0.18 μm standard digital CMOS technology with low-resistivity substrate. Note that other device technologies can also be used for DAWG implementation. The chip micrograph is shown in FIG. 5. The chip size is 1.48 mm×1.24 mm, including pads. The core circuit size is 0.68 mm×0.5 mm.

Figure 7:
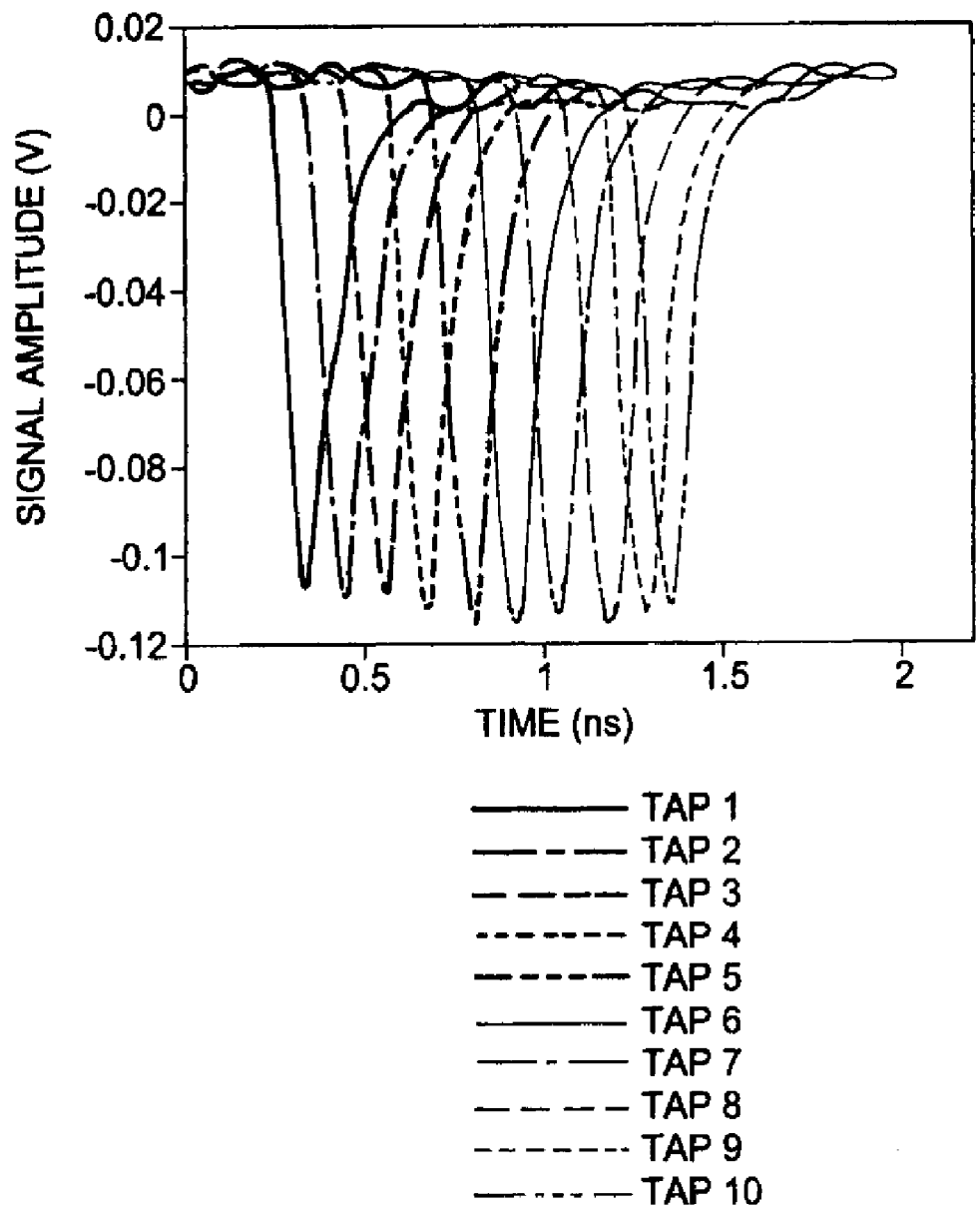
FIG. 7 shows pulses generated by each tap.

The prototype DAWG is characterized in time domain using a 50 GHz sampling oscilloscope. A 500 MHz sinusoidal signal from a continuous-wave (CW) source is used as the input trigger. The delay uniformity of all ten taps can be observed in FIG. 7. The tap delays are 101 ps, 109 ps, 112 ps, 129 ps, 120 ps, 118 ps, 133 ps, 108 ps, 73 ps. They are measured between the middle point of rise edges. The average tap delay is 111.4 ps with a standard deviation σ of 16.6 ps, which corresponds to a sample rate of 9 GSample/s. The last delay element does not have a load, which causes a delay (73 ps) much smaller than others. On average, the rise time is 79 ps with a 6 of 3.8 ps, the fall time is 177 ps with a σ of 3.2 ps, and the minimum pulse width is 140 ps with a σ of 4.6 ps.

Figure 8:
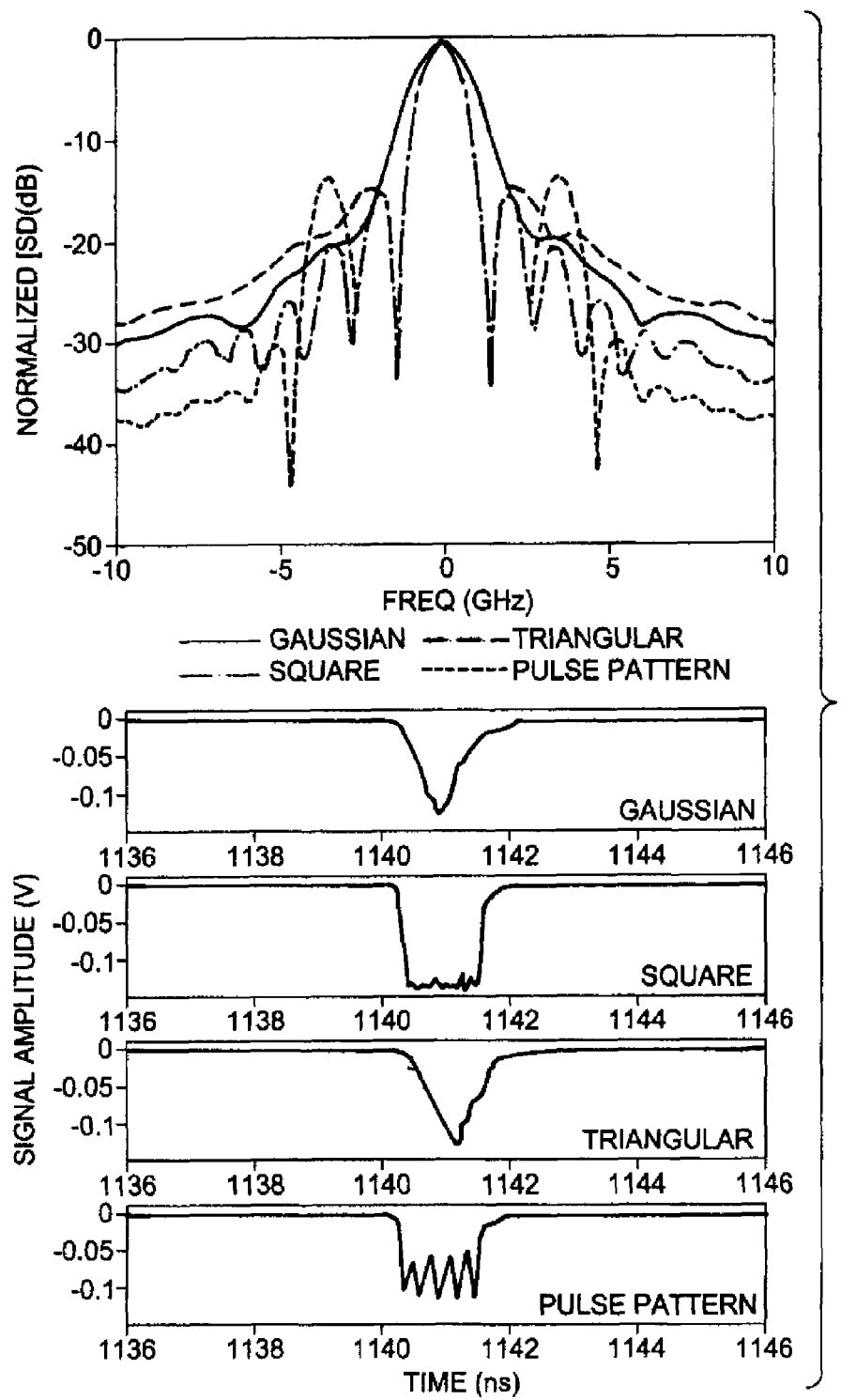

Four example waveforms, Gaussian, square, triangular and fork, are synthesized to demonstrate the reconfigurability of the prototype DAWG (FIG. 8A). The frequency spectra of these waveforms are shown in FIG. 8B. The Gaussian and triangular waveforms show wider spectrum mainlobe and lower sidelobes than the square waveform and pulse pattern. In terms of sidelobe magnitude, the Gaussian waveform has better rejection than the triangular one. Because the output pulses have negative polarity only in this prototype, the generated waveform spectra are centered at DC. The power consumption of the active delay line and all pulse generators is about 22 mW at 500 MHz repetition rate, and about 42 mW at 1 GHz. Most power is consumed by the active delay line which needs to have enough driving capability for pulse generators. The power consumption for a single switched current source is about 0.8 mW at 500 MHz repetition rate, and about 1.8 mW at 1 GHz.

Figure 9:
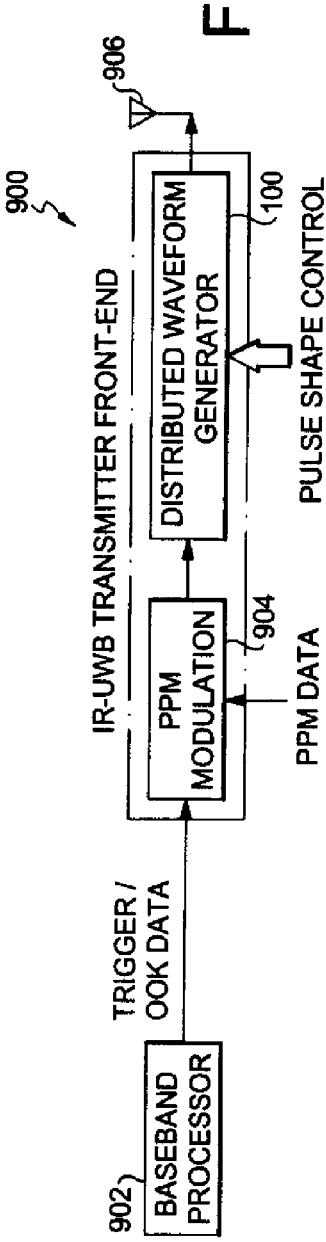
FIG. 9 is a schematic diagram showing an ultra-wideband radio using the DAWG according to the preferred embodiment.

FIG. 9 shows the architecture of proposed DAWG-based ultra-wideband transmitter 900. The transmitter integrates a modulator for pulse position modulation (PPM) and a distributed waveform generator (DAWG) as described above. The input trigger signal from a baseband processor 902 is modulated by the PPM signal first in a PPM modulation block 904, and then distributed to the DAWG 100 for use as the trigger signal described above to generate the target UWB waveforms, which can then be transmitted over an antenna 906. In such a transmitter architecture, the trigger signal runs at the pulse repetition frequency (PRF), which is usually at a much lower speed than the sampling rate. The modulation is performed on the trigger signal instead of generating short pulses to reduce the circuit speed requirement. Hence, low-power digital circuits can be employed to implement both a PPM modulator and a trigger distribution block. The DAWG 100 can be modified such that the impulse generator generates both positive and negative pulses.

While preferred embodiments have been described above, those skilled in the art who have reviewed the present disclosure will readily appreciate that other embodiments can be realized within the scope of the invention. For example, both numerical values and fabrication techniques are illustrative rather than limiting. Therefore, the present invention should be construed as limited only by the appended claims.

We claim:

1. A distributed arbitrary waveform generator for generating an arbitrary waveform, the distributed arbitrary waveform generator comprising:
a plurality of pulse generators, each for producing a pulse;
a trigger distribution network for receiving a trigger signal and for distributing the trigger signal among the plurality of pulse generators; and
a pulse combining circuit, in communication with the plurality of pulse generators, for receiving the pulse produced by each of the plurality of pulse generators and for combining the pulses into the arbitrary waveform.

2. The distributed arbitrary waveform generator of claim 1, wherein the trigger distribution network comprises a delay line.

3. The distributed arbitrary waveform generator of claim 2, wherein the delay line comprises an active delay line.

4. The distributed arbitrary waveform generator of claim 3, wherein the active delay line is asynchronous and comprises:
a plurality of buffers in series; and
a control signal applying line for applying a control signal to each of the buffers to control a tap delay of said each of the buffers.

5. The distributed arbitrary waveform generator of claim 3, wherein the active delay line is synchronous and comprises:
a plurality of flip-flops in series; and
a clock signal applying line for applying a clock signal to each of the plurality of flip-flops to control a tap delay of said each of the flip-flops.

6. The distributed arbitrary waveform generator of claim 1, wherein each of the plurality of pulse generators comprises:
an impulse generation block, receiving the trigger signal, for generating an impulse;
a pulse width control block, responsive to the impulse, for controlling a width of the pulse; and
a pulse amplitude control block, responsive to the impulse for controlling an amplitude of the pulse.

7. The distributed arbitrary waveform generator of claim 6, wherein:
the pulse amplitude control block comprises a tunable current generator for generating a current; and
the pulse width control block comprises a switch for switching the current from the tunable current generator on and off in response to the impulse.

8. The distributed arbitrary waveform generator of claim 6, wherein the pulse width control block comprises a feedback loop with a variable delay time.

9. The distributed arbitrary waveform generator of claim 6, wherein each of the plurality of pulse generators further comprises a digital-to-analog converter for controlling the pulse amplitude control block.

10. The distributed arbitrary waveform generator of claim 9, wherein the digital-to-analog controller is implemented in the pulse amplitude control block.

11. The distributed arbitrary waveform generator of claim 1, wherein the pulse combining circuit comprises an on-chip transmission line.

12. The distributed arbitrary waveform generator of claim 11, wherein the on-chip transmission line comprises an elevated coplanar waveguide transmission line.

13. The distributed arbitrary waveform generator of claim 12, wherein the on-chip transmission line is formed in at least one of a U shape and a meandering shape.

14. An ultrawideband transmitter comprising:
(a) a baseband generator for generating a trigger signal;
(b) a pulse position modulator for modulating the trigger signal in accordance with information to be transmitted;
(c) a distributed arbitrary waveform generator for generating an arbitrary waveform, the distributed arbitrary waveform generator comprising:
a plurality of pulse generators, each for producing a pulse;

a trigger distribution network for receiving the trigger signal from the pulse position modulator and for distributing the trigger signal among the plurality of pulse generators; and a pulse combining circuit, in communication with the plurality of pulse generators, for receiving the pulse produced by each of the plurality of pulse generators and for combining the pulses into the arbitrary waveform; and (d) a transmitting component for transmitting the arbitrary waveform.

15. A distributed arbitrary waveform generator for generating an arbitrary waveform, the distributed arbitrary waveform generator comprising:

a plurality of pulse generators, each for producing a pulse;

a trigger distribution network for receiving a trigger signal and for delaying and distributing the trigger signal among the plurality of pulse generators; and a pulse combining circuit, in communication with the plurality of pulse generators, for receiving the pulse produced by each of the plurality of pulse generators and for combining the pulses into the arbitrary waveform.

* * * * *